US006989591B1

(12) United States Patent
Pilat

(10) Patent No.: US 6,989,591 B1
(45) Date of Patent: Jan. 24, 2006

(54) METHOD FOR MAKING AN INTEGRATED CIRCUIT OF THE SURFACE-MOUNT TYPE AND RESULTING CIRCUIT

(75) Inventor: Eric Pilat, Brison St Innocent (FR)

(73) Assignee: Atmel Grenoble S.A., St. Egreve (FR)

(*) Notice: Subject to any disclaimer, the term of this patent is extended or adjusted under 35 U.S.C. 154(b) by 309 days.

(21) Appl. No.: 10/333,252

(22) PCT Filed: Jul. 18, 2000

(86) PCT No.: PCT/FR00/02063

§ 371 (c)(1),
(2), (4) Date: Jan. 17, 2003

(87) PCT Pub. No.: WO02/07208

PCT Pub. Date: Jan. 24, 2002

(51) Int. Cl.
H01L 23/48 (2006.01)
H01R 9/00 (2006.01)

(52) U.S. Cl. ............ 257/697; 257/730; 257/772; 257/779; 257/780; 361/772; 361/774

(58) Field of Classification Search ............ 257/690, 257/697, 730, 772, 779, 780; 361/760, 772, 361/773, 774
See application file for complete search history.

(56) References Cited

U.S. PATENT DOCUMENTS 4,396,140 A    8/1983   Panousis et al.
4,759,491 A    7/1988   Fisher et al.
5,839,191 A    11/1998  Norell et al.
5,847,458 A *  12/1998  Nakamura et al. .......... 257/738
6,002,172 A *  12/1999  Desai et al. ................ 257/737
6,007,348 A    12/1999  Murphy et al.

FOREIGN PATENT DOCUMENTS

| DE | 198 07 279 A |   | 9/1999 |
| EP | 396248 A2 | * | 11/1990 |
| FR | 2 789 225 A |   | 8/2000 |
| JP | 01270391 A | * | 10/1989 |
| JP | 01278967 A | * | 11/1989 |
| JP | 06132439 A | * | 5/1994 |
| JP | 08167772 A | * | 6/1996 |
| WO | WO0207208 A1 | * | 1/2002 |

* cited by examiner

Primary Examiner—Alonzo Chambliss
(74) Attorney, Agent, or Firm—Lowe Hauptman & Berner, LLP

(57) ABSTRACT

The invention relates to a method for making an integrated circuit (40) of the surface-mount type the comprising, first of all, manufacture of a package having a rear face and a pin grid array extending under this rear face perpendicular thereto, and a ball (44) of low melting point alloy is then formed at the end of each pin surrounding this end and soldered thereto.

The invention also relates to an integrated circuit (40) of the surface-mount type, comprising a package having a rear face and a pin grid array, of a cross section roughly constant along the pin (42), extending under the rear face perpendicular thereto. A ball (44) of low melting point alloy is soldered to the end of each pin (42) surrounding this end.

18 Claims, 4 Drawing Sheets

METHOD FOR MAKING AN INTEGRATED CIRCUIT OF THE SURFACE-MOUNT TYPE AND RESULTING CIRCUIT

The invention relates to a method for making an integrated circuit for the surface-mounting of electronic boards. More specifically, the invention relates to the production of electrical connections between the package and the printed circuit of the electronic board.

The increasing complexity of integrated electronic circuits, and the increase in the number of semiconductors that can be integrated into the self-same chip is leading to an increase in the number and density of integrated circuit output connections. Integrated circuit surface connection technology is ever evolving along these lines.

Certain integrated circuit packages of the prior art have rows of leads arranged with a uniform pitch, perpendicular to the edges of the integrated circuit, the end of each of the leads being bent at 90° with respect to a rear face of the integrated circuit, this rear face facing a face on which the electronic board to which the integrated circuit will be soldered is mounted. Bending the leads at 90° allows them to be soldered to the mounting face of the board. This type of connection, commonly known as dual-in-line or DIL, has the disadvantage of being bulky and of allowing only the production of packages with a limited number of outputs.

Connections using an array of pins or connection technologies known as pin grid arrays or PGAs have long been used in microelectronics. The rear face of the printed circuit package produced using this PGA technology is equipped with the array of pins which are situated under this rear face and are perpendicular to this face. In this connection technology, the pins have to be inserted into the electronic board, and this uses up a significant amount of space.

In the technology of surface-mount integrated circuits (SMCs) J-shaped leads or J-leads bent on the edges of the integrated circuit package are soldered to the printed circuit.

In the latest generations of integrated circuit packages, the connection between the integrated circuit and the printed circuit is performed by an array of balls made of tin/lead alloy. This technology, known as Ball Grid Array or BGA allows a very dense packing of connections which is vertically shorter, thus shortening the length of the connections between the integrated circuit and the electronic board. One of the advantages of this technology is its better frequency behavior.

At the outset, the BGA technology was developed in order to obtain a high number of output pins on small footprint packages, but these days this technology is used even for small chips with a small number of outputs (for example 40-pin memories).

FIG. 1 depicts a sectioned part view of a ceramic package 10 of an integrated circuit comprising a chip 12 mounted on the package. FIG. 1 shows details of one of the output connections of the package using connection technology of the ball grid array or BGA type.

In this example of FIG. 1, the chip 12 is inverted so as to show its electrical access points situated on its active face, facing the substrate for interconnection of the package 10, so as to be soldered directly to the substrate of the package. In other embodiments, the chip (not inverted) may be soldered to the package by wire connections.

The chip 12 is connected by soldered connections 14 to internal connections 16 of the package 10. The internal connections 16 are performed on the outside of the package, via metal pads 18 situated on the same side as a rear face 19 of the package 10. Balls 20 made of tin/lead alloy intended to be soldered to the printed circuit (not depicted in the figure) are soldered to the metal pads 18.

This type of BGA connection in FIG. 1 has significant disadvantages. Specifically, when the substrates of the package and that of the board on which the package is mounted have different coefficients of expansion, for example in the case of a ceramic package and a board made of epoxy resin, the differential expansion between these two substrates as the temperature varies causes the solder balls 20 to break. The height of the balls made of tin/lead alloy is not enough to alleviate this problem and the soldered joints break relatively quickly with thermal cycles.

The breakages of the solder balls may occur, on the one hand, at the time of the soldering of the package to the electronic board because of the thermal shock produced as the ball 20 melts then cools relatively quickly and, on the other hand, during operation of the integrated circuit when there are variations in the ambient temperature, it being possible for this variation in ambient temperature to be very great and very rapid (−55° C. to +150° C.) in the case of military applications.

Another disadvantage with this connection technology of the ball grid array or BGA type is that the package is difficult to recover in order to replace an expensive component in the event of breakdown.

Package manufacturers are proposing solutions for avoiding the breakage of the solder balls of the packages soldered to a board.

FIG. 2 shows one solution which consists in using an insert 22 consisting essentially of a ceramic plate 24 with holes 26. The holes 26 are arranged with the same pitch as the metal pads 18 of the connections of the package.

Before the insert 22 is mounted on the package, an elongate-shaped solder ball 28 is produced in each of the holes 26, the balls 28 protruding from each side of the ceramic plate 24.

The ceramic plate with the elongate balls 28 is arranged, on the side of one of its faces, under the rear face 19 of the package 10. The ends of the balls protruding from the holes on one and the same side of the ceramic plate are soldered to the respective metal pads 18 of the package connections.

The other ends of the balls, protruding from the other side of the ceramic plate, which are intended to be soldered to an electronic board, are taller than the ends of the balls soldered to the package. The thermal stresses exerted on the balls of the package equipped with the insert once soldered to the board are thus spread over the periphery of the ball.

When it is desirable to have a greater ball height, the balls then being in the form of columns, so as to withstand greater thermal stresses, it is necessary to use an appropriate mold.

Another solution for avoiding the breakage of the solder balls is depicted in FIG. 3.

A package 30 is hollowed out with semispherical cavities 32 at the points of connection of the package. Into each of the cavities 32 covered with a layer of metal 34 is inserted a spherical solder ball 36. In this type of connection involving a cavity, the thermal stresses are spread over a larger area without having to use an insert that requires a mold in order to produce it.

In the case of ceramic packages, the balls used for the solder are usually made of an alloy containing 93% lead and 7% tin and which are not readily moldable. In the case of plastic packages, the alloy contains 63% lead and 37% tin. It would not be possible to use an alloy containing 63% lead and 37% tin in the case of ceramic packages because that would lead to excessive crushing of the balls when soldering the package to the board.

The current solutions to the problem of the breakage of the soldered joints are not satisfactory in terms of cost or performance. In particular, the insert is an expensive solution. The use of the columns limits the problem of ball breakage but this solution, in military applications, is nonetheless technically inadequate.

In order to alleviate the integrated circuit package connection problems of the prior art, the invention proposes a method for making an integrated circuit of the surface-mount type, comprising, first of all, the manufacture of a package having a rear face and a pin grid array, the array extending under this rear face perpendicular thereto and then the formation at the end of each pin of a ball of low melting point alloy surrounding this end and soldered thereto, characterized in that, in order to form the ball at the end of each pin:

- a cellular plate the working cells of which are distributed at the same pitch as the pins of the package of the integrated circuit are filled with a solder cream formed from the material of the alloy;
- the pins of the pin grid array of the integrated circuit are inserted into the cells containing the solder cream, the integrated circuit being on top of the cellular plate;
- the cellular plate is heated until the alloy melts;
- the cellular plate is cooled very quickly so as not to allow the liquid alloy enough time to wick up along the pins;
- the integrated circuit and the cellular plate secured to the circuit by the solidified alloy in the cells is then inverted so as to place the cellular plate on top of the integrated circuit, the integrated circuit being suspended from the cellular plate by its pins held in the alloy solidified in the cells;
- the cellular plate is heated until the solder in the cells melts, causing the integrated circuit to separate from the cellular plate under gravity and causing solder balls to form at the ends of the pins, the alloy having wetted the pins sufficiently for it to remain attached to the pins and solidifying quickly in the form of balls as soon as the integrated circuit separates from the cellular plate, the alloy not having time to spread out along the pins.

The invention also proposes an integrated circuit of the surface-mount type achieved by the method of manufacture according to the invention, comprising a package having a rear face and a pin grid array extending under the rear face perpendicular thereto, characterized in that the end of each pin has a ball of low melting point alloy soldered to the end of each pin surrounding this end.

In certain embodiments of the integrated circuit according to the invention, the length of pin end surrounded by the ball is roughly equal to the diameter of the ball. This results in particular embodiments such that, in a first embodiment, the length of pin end surrounded by the ball is equal to the length of pin protruding from the rear face of the package and, in a second particular embodiment, the length of pin protruding from the rear face of the package is greater than the diameter of the ball.

In other embodiments of the integrated circuit according to the invention, the length of pin end surrounded by the ball is less than the diameter of the ball.

The invention may apply to integrated circuits produced with either ceramic packages or plastic packages.

The method of manufacture according to the invention is particularly well suited to integrated circuits comprising pins the cross section of which is roughly constant along the pin, particularly when the pins are smooth, which they generally are.

Other features and advantages of the invention will become apparent from reading the detailed description given thereof with reference to the appended drawings in which:

FIG. 1, already described, depicts a sectioned part view of a ceramic package of the prior art;

FIG. 2, already described, shows a sectioned view of the package of FIG. 1, using an insert;

FIG. 3, already described, shows a sectioned view of a package of the prior art comprising solder balls arranged in cavities of the package;

Figure 1:
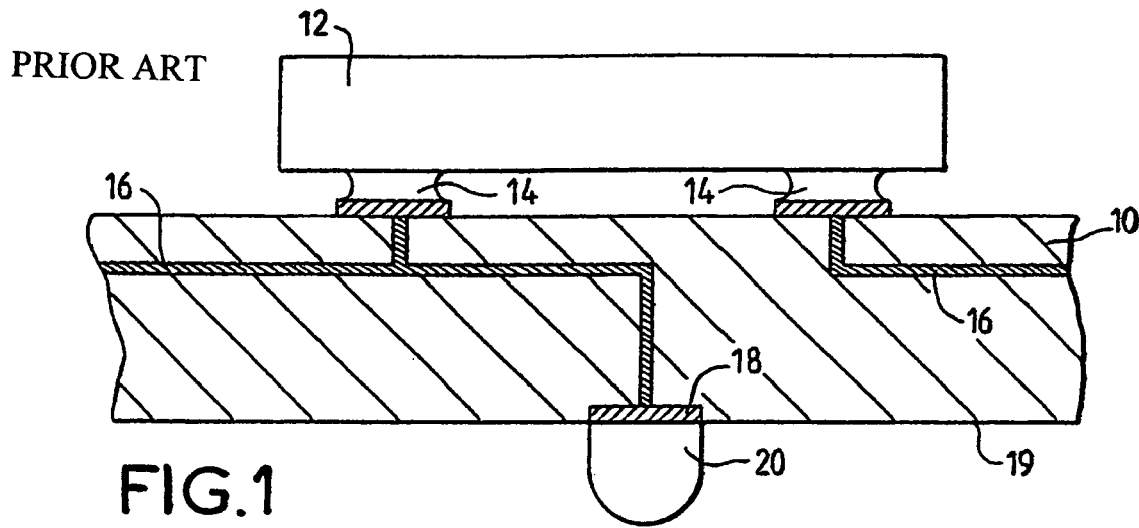
Figure 2:
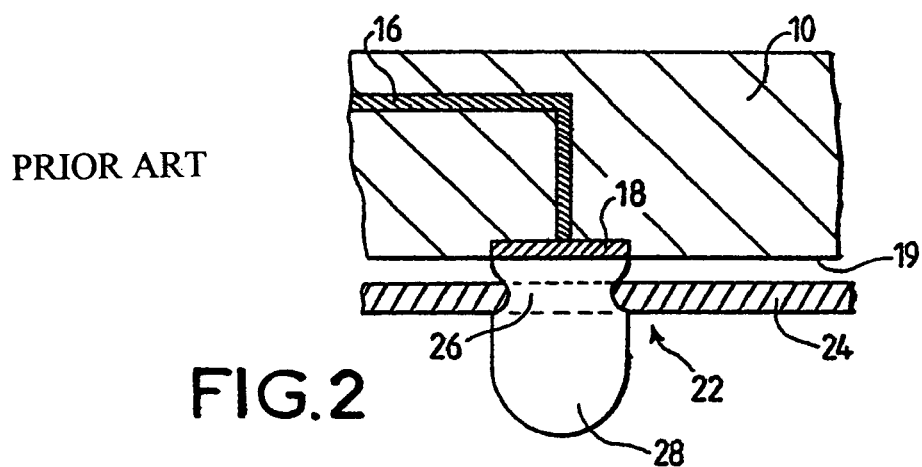
Figure 3:
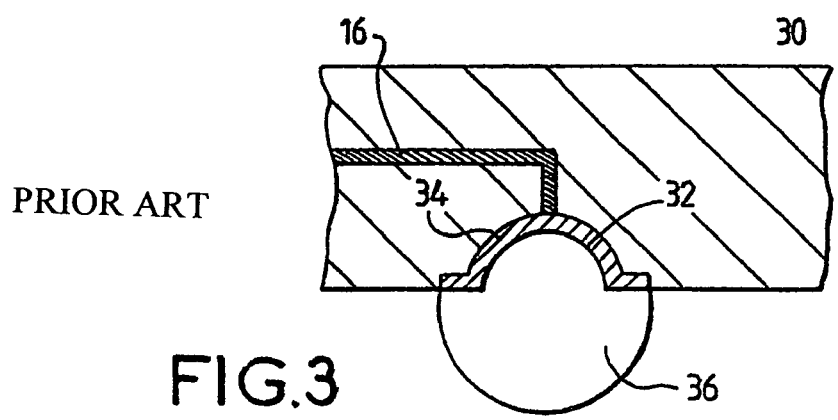
Figure 4:
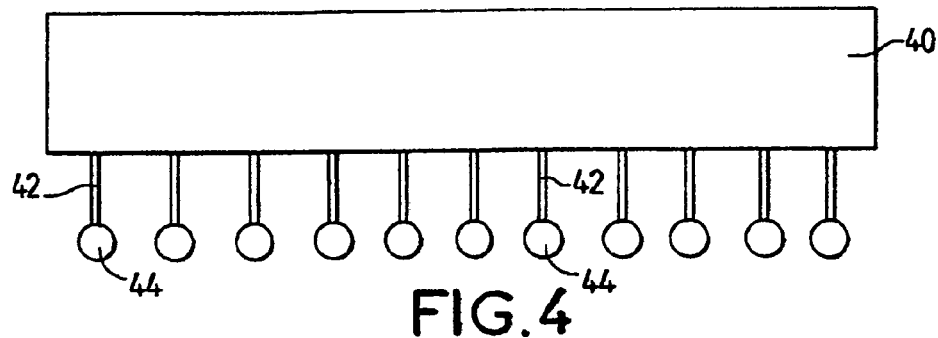
FIG. 4 depicts an integrated circuit according to the invention comprising pins with solder balls.

FIG. 4 shows an integrated circuit 40 according to the invention comprising smooth connection pins 42 of a cross section roughly constant along the pin, each of the pins having, at its end, a ball 44 of solder surrounding this end. The pins are made of ferronickel which is plated with nickel then plated with gold, in the case of ceramic packages, and with Kovar in the case of plastic packages.

The integrated circuit 40 can be produced with various configurations regarding the length of the pins and the positions of the balls at the ends of the pins. FIGS. 5a to 5d show details of one of the pins of the integrated circuit with various configurations.

Figure 5A:
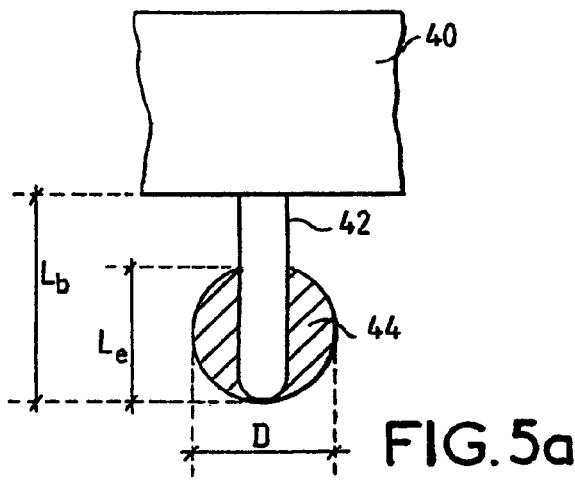
FIGS. 5a, 5b, 5c and 5d depict detailed views of various embodiments of pins of the integrated circuit according to the invention.

FIG. 5a shows details of one of the pins of an embodiment of the integrated circuit 40 equipped with pins of a length Lb greater than the diameter of the ball 44 soldered to its end. Considering the part of the pin Le surrounded by the ball, that we shall hereinafter term the pin end, in the embodiment of FIG. 5a, the length of the pin end is roughly identical to the diameter D of the ball 44. This embodiment has the advantage of not causing the solder balls to become crushed as they melt, as the integrated circuit is transferred onto the board. What happens is that the balls are internally reinforced by their respective pins which pass right through their diameter D.

Figure 5B:
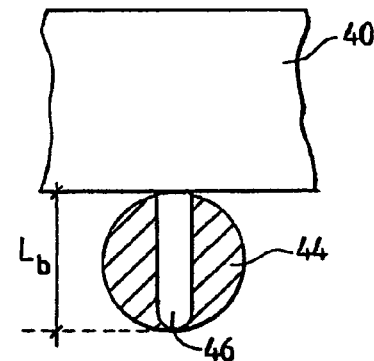

In another embodiment, the integrated circuit is equipped with short pins 46, the length of which is roughly equal to the diameter of the solder ball 44, the ball surrounding the entirety of the pin. FIG. 5b depicts a view of one of the pins of such an integrated circuit. This configuration with short pins allows the package to be soldered very close to the printed circuit of the board while at the same time avoiding the crushing of the solder ball under the weight of the integrated circuit as it is transferred onto the electronic board, the ball being reinforced, as in the embodiment of FIG. 5a, over the entirety of its diameter D.

In other embodiments of the integrated circuit, the length of the pin end Le, surrounded by the ball 44, is less than the diameter of the ball.

Figure 5C:
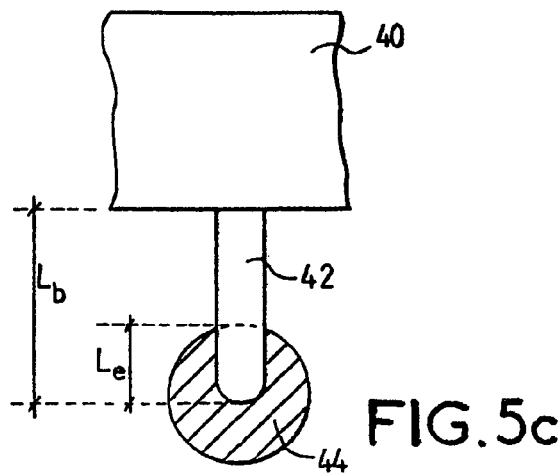

FIG. 5c shows details of one configuration of the pin 42 of FIG. 5a, in which configuration the length of the pin end Le surrounded by the ball 44 is less than the diameter D of the ball.

Figure 5D:
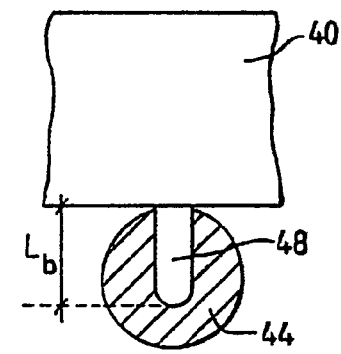

FIG. 5d shows details of a short pin 48 in a different configuration from that of FIG. 5b. In the configuration of FIG. 5d, the length Lb of the pin is less than the diameter D of the ball, all of the pin 48 being surrounded by the ball 44.

The balls 44 of the various configurations of the pins may be produced from an alloy containing 63% lead and 37% tin which has only advantages, namely:

a very low melting point;

wettability;

the fact that it is an alloy identical to the one used on the printed circuit; or any other alloy suited to the transfer of components onto the surface.

Figure 6:
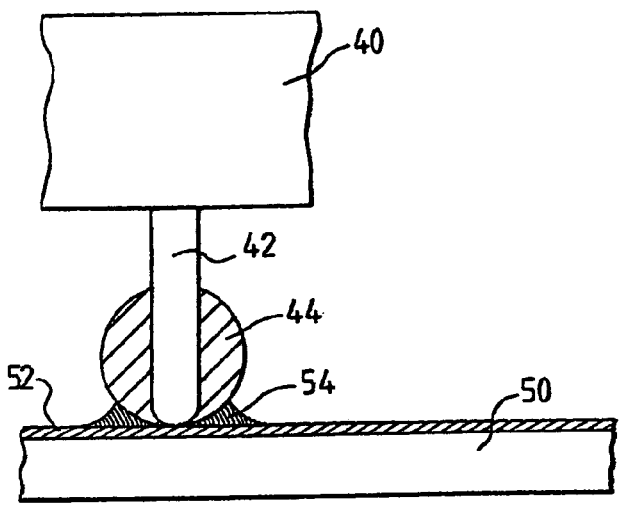
FIG. 6 shows a detailed view of a pin of the integrated circuit of FIG. 4 soldered to an electronic board.

FIG. 6 shows details of the pin 42 of FIG. 5a after the integrated circuit 40 has been soldered to an electronic board 50 having mounting metallizations 52. The metallizations have, on their surface, solder 54 made of an alloy generally containing 63% lead and 37% tin.

In the embodiments of FIGS. 5a and 5b, at the time that the integrated circuit is mounted on the board, the solder 54 on the metallization 52 rises up toward the end of the pin 42. It is therefore not necessary to crush the solder ball 44 in order to solder the pins to the board.

Another advantage of this invention lies in the fact that even if the solder between the pin and the metallization of the board breaks, electrical contact will be afforded by the pin in contact with the plating. Indeed, the pin which is soft-soldered to the ceramic package is a very secure connection.

FIGS. 7, 8, 9 and 10 show the main phases of the method of manufacture according to the invention for making the integrated circuit of FIG. 4.

Figure 7:
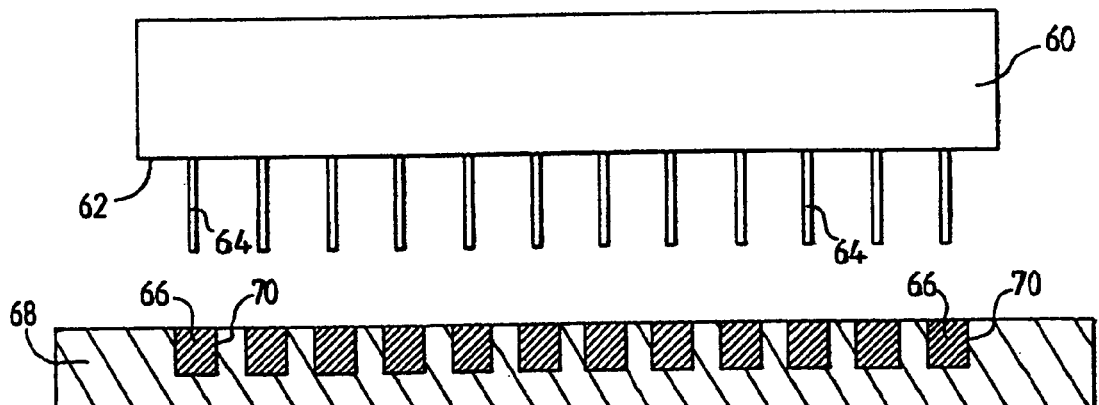
FIGS. 7, 8, 9 and 10 show various steps in the manufacture of the integrated circuit according to the invention.

In a first phase shown in FIG. 7, an integrated circuit 60 of the surface-mountable type is made, this involving first of all making a package having a rear face 62 and a pin grid array of smooth pins 64 extending under this rear face perpendicular thereto.

The length and the diameter of the pins 64 will be chosen according to the constraints of the application and the reliability requirements.

The ends of the pins 64 may be tinned or dipped in flux or any other suitable chemical composition depending on the surface finish of the printed circuit 60 using PGA technology.

In the first phase depicted in FIG. 7, a cellular plate 68, the cells 70 of which are distributed on the plate with the same pitch as the pins 64 of the package of the printed circuit 60, is filled with a solder cream 66 made from the material of the alloy and solvents.

Figure 8:
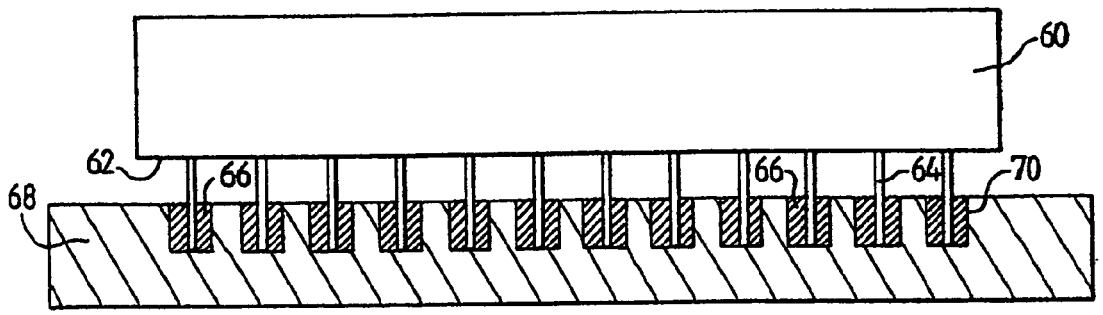

In a second phase depicted in FIG. 8, the ends of the pins 64 of the pin grid array of the integrated circuit 60 are inserted into the cells 70 containing the solder cream 66, the integrated circuit being on top of the cellular plate, then the alloy is heated by passing the cellular plate over a hot plate until the alloy melts and the cellular plate is cooled very quickly so as not to give the liquid alloy time to wick up along the pins causing the alloy to solidify in the cells.

Figure 9:
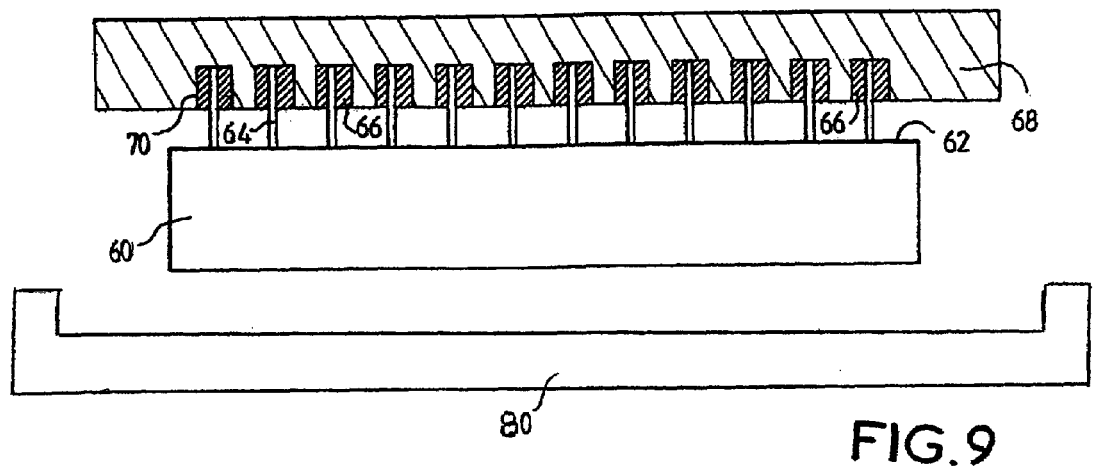

In a third phase, depicted in FIG. 9, the integrated circuit 60 and the cellular plate 68 secured to the integrated circuit by the alloy solidified in the cells is inverted so as to place the cellular plate on top of the integrated circuit. In this phase, the integrated circuit is suspended from the cellular plate by its pins held in the alloy solidified in the cells 70 of the plate.

Figure 10:
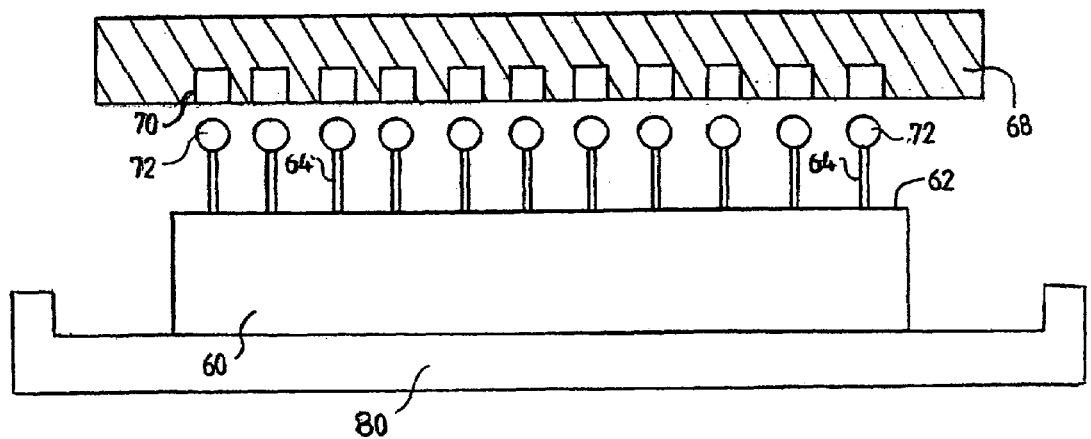

In a fourth phase depicted in FIG. 10, the cellular plate is heated until the alloy in the cells melts, causing the integrated circuit to separate from the cellular plate under gravity and causing solder balls 72 to form at the ends of the pins. The alloy has wetted the pins sufficiently to remain attached to the pins, solidifying quickly into the form of balls, as soon as the integrated circuit separates from the cellular plate, the alloy not having time to spread out along the pins. In this fourth phase, the integrated circuit, as the alloy melts again in the cells, drops under its own weight onto a receptacle 80 provided for this purpose, situated under the integrated circuit (see FIG. 10). The distance between the integrated circuit and the receptacle is at minimum equal to the depth of the cells in the cellular plate.

It must be pointed out that, in the second phase of the manufacturing method depicted in FIG. 8, the order of the two operations consisting in inserting the ends of the pins 64 of the integrated circuit 60 into the cells 70 containing the solder cream 66 and in heating the alloy by passing the cellular plate over a hot plate until the alloy melts is unimportant and can be reversed without changing the result. It is thus also possible first of all to melt the solder cream in the cells then to insert the ends of the pins 64 of the integrated 60 into the cells.

The solder paste, formed for example from an alloy material containing 63% lead and 37% tin, may be made from any other alloy suited to the surface mounting of components.

This technology of mounting solder balls at the ends of the pins is very inexpensive and does not require a machine for positioning preformed balls.

The cellular plate 68 is made either of graphite or of titanium or of some other material suited to reflow. The solder cream usually contains 50% tin/lead alloy and 50% fluid.

In general, in the manufacturing method, the ends of the pins are inserted into the cellular plate as far as the closed ends of the cells, so as to obtain the pins of FIGS. 5a and 5b, the solder balls surrounding the end of the pin over a length roughly equal to the diameter D of the ball.

In an alternative form of the method for making the integrated circuit, the molten alloy in the cells of the cellular plate is obtained by placing sized balls of alloy in a cellular plate, the balls are melted and the pins of the pin grid array of the integrated circuit are inserted into the cells containing the molten alloy, the integrated circuit being on top of the cellular plate, the next steps being the same as in the method described above, namely:

the cellular plate is cooled very quickly so as not to allow the liquid alloy enough time to wick up along the connections;

the integrated circuit and the cellular plate secured to the circuit by the solidified alloy in the cells is then inverted so as to place the cellular plate on top of the integrated circuit, the integrated circuit being suspended from the cellular plate by its pins held in the alloy solidified in the cells;

the cellular plate is heated until the solder in the cells melts, causing the integrated circuit to separate from the cellular plate under gravity and causing solder balls 72 to form at the ends of the pins.

It must be pointed out that, in this alternative form of the method of manufacture, the order of the two operations consisting in melting the balls placed in the cells and in inserting the pins of the pin grid array of the integrated circuit into the cells containing the molten alloy is unimportant and can therefore be reversed without changing the result. It is thus also possible to insert the pins of the pin grid array of the integrated circuit into the cells containing the sized balls, then for the balls to be melted.

The method of manufacture according to the invention converts an integrated circuit having connectors of the PGA type into BPGA, namely ball pin grid array, technology.

Once the integrated circuit has been produced, it is mounted on its electronic board using the same method as a conventional BGA.

The integrated circuit according to the invention makes it possible to obtain very densely packed connections while at the same time guaranteeing better reliability, ease of repair of the circuit and the possibility of extracting heat from between the connected substrates.

What is claimed is:

1. A method for making an integrated circuit of the surface-mount type, comprising, first of all, the manufacture of a package having a rear face and a pin grid array, the array extending under this rear face perpendicular thereto and then the formation at the end of each pin of a ball of low melting point alloy surrounding this end and soldered thereto, wherein, in order to form the ball at the end of each pin:

working cells of a cellular plate are distributed at the same pitch as the pins of the package of the integrated circuit are filled with a solder cream formed from the material of the alloy;

the pins of the pin grid array of the integrated circuit are inserted into the cells including the solder cream, the integrated circuit being on top of the cellular plate;

the cellular plate is heated until the alloy melts;

the cellular plate is cooled very quickly so as not to allow the liquid alloy enough time to wick up along the pins;

the integrated circuit and the cellular plate secured to the pins of the circuit by the solidified alloy in the cells is then inverted so as to place the cellular plate on top of the integrated circuit, the integrated circuit being suspended from the cellular plate by its pins held in the alloy solidified in the cells;

the cellular plate is heated until the solder in the cells melts, causing the integrated circuit to separate from the cellular plate under gravity and causing solder balls to form at the ends of the pins, the alloy having wetted the pins sufficiently for it to remain attached to the pins and solidifying quickly in the form of balls as soon as the integrated circuit separates from the cellular plate, the alloy not having time to spread out along the pins.

2. The method for making an integrated circuit of the surface-mount type as claimed in claim 1, wherein the ends of the pins are inserted in the cellular plate as far as the closed end of the cells.

3. The method for making an integrated circuit of the surface-mount type as claimed in claim 1, wherein the cellular plate is made either of graphite or of some other material suited to reflow.

4. The method for making an integrated circuit of the surface-mount type as claimed in claim 1, wherein the length of pin end Le surrounded by the ball is roughly equal to the diameter D of the ball.

5. The method for making an integrated circuit of the surface-mount type as claimed in claim 4, wherein the length of pin end Le surrounded by the ball is equal to the length of pin Lb protruding from the rear face of the package.

6. The method for making an integrated circuit of the surface-mount type as claimed in claim 1, wherein the length of pin protruding from the rear face of the package is greater than the diameter of the ball.

7. The method for making an integrated circuit of the surface-mount type as claimed in claim 1, wherein the length of pin end Le surrounded by the ball is less than the diameter of the ball.

8. The method for making an integrated circuit of the surface-mount type as claimed in claim 1, wherein the ball is a tin/lead alloy.

9. The method for making an integrated circuit of the surface-mount type, comprising, first of all, the manufacture of a package having a rear face and a pin grid array, the array extending under this rear face perpendicular thereto and then the formation at the end of each pin of a ball of low melting point alloy surrounding this end and soldered thereto, wherein, in order to form the ball at the end of each pin:

sized balls of alloy are placed in the cells a cellular plate, the cells of which are set out at the same pitch as the pins of the package of the integrated circuit;

the balls are melted;

the pins of the pin grid array of the integrated circuit are inserted into the cells containing the molten alloy, the integrated circuit being on top of the cellular plate;

the cellular plate is cooled very quickly so as not to allow the liquid alloy enough time to wick up along the connections;

the integrated circuit and the cellular plate secured to the pins of the circuit by the solidified alloy in the cells is then inverted so as to place the cellular plate on top of the integrated circuit, the integrated circuit being suspended from the cellular plate by its pins held in the alloy solidified in the cells;

the cellular plate is heated until the solder in the cells melts, causing the integrated circuit to separate from the cellular plate under gravity and causing solder balls to form at the ends of the pins, the alloy having wetted the pins sufficiently for it to remain attached to the pins and solidifying quickly in the form of balls as soon as the integrated circuit separates from the cellular plate, the alloy not having time to spread out along the pins.

10. The method for making an integrated circuit of the surface-mount type as claimed in claim 1, wherein the pins have a cross section which is roughly constant along the pin.

11. The method for making an integrated circuit of the surface-mount type as claimed in claim 1, wherein the pins are smooth.

12. The method for making an integrated circuit of the surface-mount type as claimed in claim 9, wherein the pins have a cross section which is roughly constant along the pin.

13. The method for making an integrated circuit of the surface-mount type as claimed in claim 9, wherein the pins are smooth.

14. The method for making an integrated circuit of the surface-mount type as claimed in claim 9, wherein the length of pin end Le surrounded by the ball is roughly equal to the diameter D of the ball.

15. The method for making an integrated circuit of the surface-mount type as claimed in claim 14, wherein the length of pin end Le surrounded by the ball is equal to the length of pin Lb protruding from the rear face of the package.

16. The method for making an integrated circuit of the surface-mount type as claimed in claim 9, wherein the length of pin protruding from the rear face of the package is greater than the diameter of the ball.

17. The method for making an integrated circuit of the surface-mount type as claimed in claim 9, wherein the length of pin end Le surrounded by the ball is less than the diameter of the ball.

18. The method for making an integrated circuit of the surface-mount type as claimed in claim 9, wherein the ball is a tin/lead alloy.

* * * * *